(12) United States Patent
Park et al.

(10) Patent No.: US 11,056,281 B2
(45) Date of Patent: *Jul. 6, 2021

(54) ELECTRONIC COMPONENT

(71) Applicant: SAMSUNG ELECTRO-MECHANICS CO., LTD., Suwon-si (KR)

(72) Inventors: Se Hun Park, Suwon-si (KR); Heung Kil Park, Suwon-si (KR); Gu Won Ji, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/552,898

(22) Filed: Aug. 27, 2019

(65) Prior Publication Data

US 2020/0135402 A1 Apr. 30, 2020

(30) Foreign Application Priority Data

Oct. 31, 2018 (KR) .................. 10-2018-0131680

(51) Int. Cl.
 *H01G 4/30* (2006.01)
 *H01G 4/248* (2006.01)
 (Continued)

(52) U.S. Cl.
 CPC ............ *H01G 4/248* (2013.01); *H01G 4/012* (2013.01); *H01G 4/232* (2013.01); *H01G 4/30* (2013.01); *H01G 4/1227* (2013.01)

(58) Field of Classification Search
 CPC .. H01G 4/30; H01G 2/06; H01G 4/12; H01G 4/228; H05K 1/0271; H05K 2201/2045
 See application file for complete search history.

(56) References Cited

U.S. PATENT DOCUMENTS 10,542,626 B2 * 1/2020 Kim ................. H05K 3/3442
10,580,574 B1 * 3/2020 Kim ................. H01G 4/002
(Continued)

FOREIGN PATENT DOCUMENTS

| JP | 2001-345399 A | 12/2001 |
| JP | 2012-204572 A | 10/2012 |
| WO | 2011/030504 A1 | 3/2011 |

*Primary Examiner* — Dion Ferguson
(74) *Attorney, Agent, or Firm* — Morgan, Lewis & Bockius LLP

(57) ABSTRACT

An electronic component includes a capacitor body including a plurality of dielectric layers and a plurality of first and second internal electrodes alternately disposed with the dielectric layers interposed therebetween, having first to sixth surfaces, and including one ends of the first and second internal electrodes exposed through the third and fourth surfaces, respectively; first and second external electrodes respectively including first and second head portions, and first and second band portions; a first connection terminal having conductive portions disposed on both ends thereof and connected to the first and second band portions, respectively; and a second connection terminal having conductive portions on both ends thereof and connected to the first and second band portions, respectively. The second connection terminal is spaced apart from the first connection terminal in a direction connecting the fifth and sixth surfaces.

12 Claims, 10 Drawing Sheets

(51) Int. Cl.
*H01G 4/232* (2006.01)
*H01G 4/012* (2006.01)
*H01G 4/12* (2006.01)

(56) References Cited

U.S. PATENT DOCUMENTS

| | | | |
|---|---|---|---|
| 10,658,118 B2* | 5/2020 | Park | H05K 1/181 |
| 2011/0180317 A1 | 7/2011 | Takahashi et al. | |
| 2013/0056252 A1* | 3/2013 | Fujii | H05K 1/0216 |
| | | | 174/260 |
| 2013/0329389 A1* | 12/2013 | Hattori | H05K 1/0216 |
| | | | 361/782 |
| 2014/0138136 A1* | 5/2014 | Ahn | H05K 3/3442 |
| | | | 174/260 |
| 2014/0284089 A1* | 9/2014 | Hattori | H01G 4/232 |
| | | | 174/258 |
| 2015/0041195 A1* | 2/2015 | Ahn | H05K 1/0306 |
| | | | 174/260 |
| 2016/0088733 A1* | 3/2016 | Lee | H05K 1/144 |
| | | | 361/768 |
| 2016/0217926 A1* | 7/2016 | Jun | H01G 4/228 |
| 2017/0278631 A1* | 9/2017 | Choi | H01G 4/232 |
| 2017/0278638 A1* | 9/2017 | Hattori | H01C 1/012 |
| 2018/0323010 A1* | 11/2018 | Park | H01G 2/065 |
| 2019/0326060 A1* | 10/2019 | Park | H01G 4/30 |

* cited by examiner

ELECTRONIC COMPONENT

CROSS-REFERENCE TO RELATED APPLICATION(S)

This application claims benefit of priority to Korean Patent Application No. 10-2018-0131680 filed on Oct. 31, 2018 in the Korean Intellectual Property Office, the disclosure of which is incorporated herein by reference in its entirety.

TECHNICAL FIELD

The present disclosure relates to an electronic component.

BACKGROUND

A multilayer electronic component such as a multilayer capacitor is formed of a dielectric material. As a dielectric material has piezoelectricity, a dielectric material may be synchronized with an applied voltage and may be deformed.

When a period of an applied voltage is within an audio frequency band, displacement of the voltage may turn into vibrations, the vibrations may be delivered to a substrate through a solder, and vibrations of the substrate may be perceived as audible sounds. The vibration sound is referred to as acoustic noise.

When a device operates in a quiet environment, a user may perceive acoustic noise as abnormal noise, and may believe that the device has malfunctioned.

Also, acoustic noise may overlap a voice output in a device having a voice circuit, and quality of the device may degrade.

Besides audible acoustic noise, when piezoelectric vibrations of a multilayer capacitor occur in a high radio frequency range of 20 kHz or higher, piezoelectric vibrations may cause malfunctions of sensors used in the IT and automotive industries.

SUMMARY

An aspect of the present disclosure is to provide an electronic component which may reduce acoustic noise and high frequency vibrations generated in a frequency of 20 kHz or higher.

According to an aspect of the present disclosure, an electronic component is provided, the electronic component comprising: a capacitor body including a plurality of dielectric layers and a plurality of first and second internal electrodes alternately disposed with the dielectric layers interposed therebetween, having first and second surfaces opposing each other, third and fourth surfaces connected to the first and second surfaces and opposing each other, fifth and sixth surfaces connected to the first and second surfaces and the fifth and fourth surfaces and opposing each other, and including one ends of the first and second internal electrodes exposed through the third and fourth surfaces, respectively; first and second external electrodes respectively including first and second head portions disposed on the third and fourth surfaces of the capacitor body, respectively, and first and second band portions extending from the first and second head portions to a portion of the first surface of the capacitor body; a first connection terminal having first and second conductive portions disposed on opposing ends thereof and connected to the first and second band portions, respectively, the first connection terminal disposed on the first surface of the capacitor body; and a second connection terminal having third and fourth conductive portions disposed on opposing ends thereof and connected to the first and second band portions, respectively, the second connection terminal disposed on the first surface of the capacitor body and spaced apart from the first connection terminal in a direction connecting the fifth and sixth surfaces.

The electronic component may further includes a conductive adhesive material disposed between the first band portion and the first conductive portion, between the first band portion and the second conductive portion, between the second band portion and the third conductive portion, and between the second band portion and the fourth conductive portion, respectively.

Each of the first and second connection terminals may include a support member made of alumina.

The support member may have a bar shape.

The support member of the first connection terminal may have opposing ends on which the first and second conductive portions are disposed, respectively, and the support member of the second connection terminal may have opposing ends on which the third and fourth conductive portions are disposed, respectively.

The first and second internal electrodes may be disposed in a direction connecting the first and second surfaces of the capacitor body.

The first and second internal electrodes may be disposed in a direction connecting the fifth and sixth surfaces of the capacitor body.

The first and second connection terminals may have first and second support members, each of which has a hexahedral shape, respectively. The first and second conductive portions may be disposed on head portions, portions of upper and lower surfaces, and portions of opposing side surfaces of the opposing ends of the first member, respectively, and the third and fourth conductive portions may be disposed on head portions, portions of upper and lower surfaces, and portions of opposing side surfaces of the opposing ends of the second member, respectively.

The first and second connection terminals may have the first and second support members, each of which has a hexahedral shape, respectively. The first and second conductive portions may be disposed on portions of upper and lower surfaces and portions of opposing side surfaces of the opposing ends of the first support member, respectively, and the third and fourth conductive portions may be disposed on portions of upper and lower surfaces and portions of opposing side surfaces of the opposing ends of the second support member, respectively.

The first and second connection terminals may have the first and second support members, each of which has a hexahedral shape, respectively. The first and second conductive portion may be disposed on head surfaces, portions of upper and lower surfaces, and portions of internal side surfaces of the opposing ends of the first support member, respectively, and the third and fourth conductive portion may be disposed on head surfaces, portions of upper and lower surfaces, and portions of internal side surfaces of the opposing ends of the second support member, respectively.

The first and second connection terminals may have the first and second support members, each of which has a hexahedral shape, respectively, and the conductive portion may be disposed in each of portions of upper and lower surfaces and portions of external side surfaces on both ends of the first and second support members. The first and second conductive portions may be disposed on portions of upper and lower surfaces and portions of external side surfaces of the opposing ends of the first support member, respectively, and the third and fourth conductive portions may be disposed on portions of upper and lower surfaces and portions of external side surfaces of the opposing ends of the second support member, respectively.

The first and second connection terminals may have the first and second support members, each of which has a hexahedral shape, respectively. The first and second conductive portions may be disposed on portions of upper and lower surfaces and portions of internal side surfaces on the opposing ends of the first support member, respectively, and the third and fourth conductive portions may be disposed on portions of upper and lower surfaces and portions of internal side surfaces on the opposing ends of the second support member, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
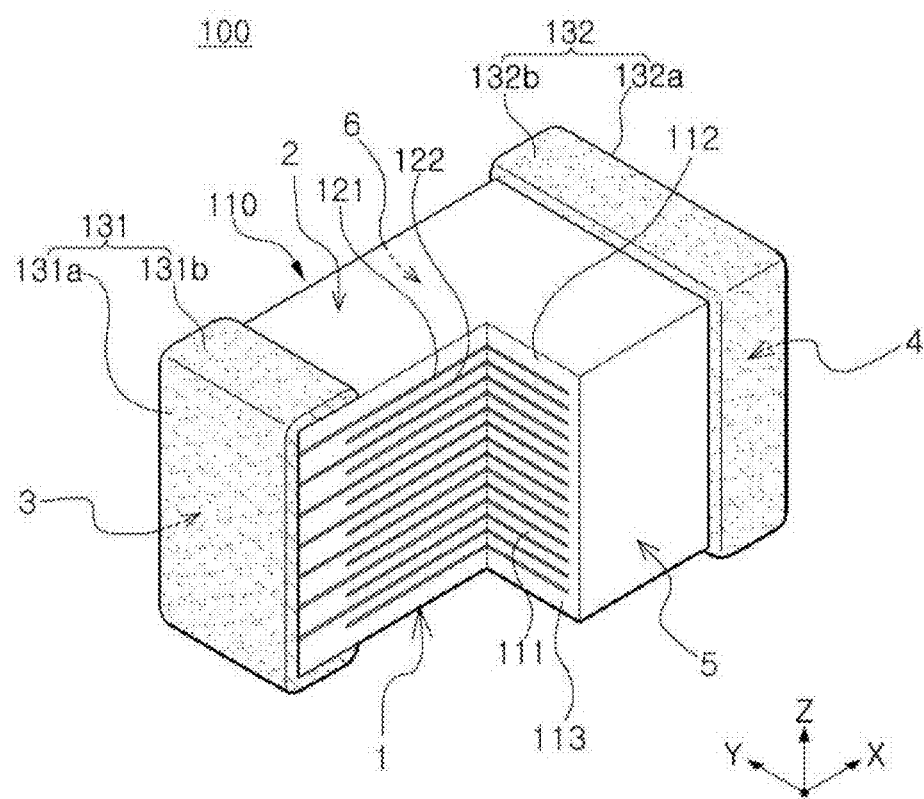
FIG. 1 is a perspective diagram illustrating a multilayer capacitor applied in an electronic component, a portion of which is cut out, according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Accordingly, shapes and sizes of elements in the drawings may be exaggerated for clarity of description, and elements indicated by the same reference numeral are same elements in the drawings.

Further, throughout the specification, it will be understood that when a portion "includes" an element, it can further include another element, not excluding another element, unless otherwise indicated.

In the drawings, an X direction, a Y direction, and a Z direction may indicate a length direction, a width direction, and a thickness direction of a multilayer capacitor, respectively.

The Z direction may be the same as a layering direction in which the dielectric layers are layered.

FIG. 1 is a perspective diagram illustrating a multilayer capacitor applied in an electronic component, a portion of which is cut out, according to an example embodiment. 2A and 2B are plan diagrams illustrating first and second internal electrodes of a multilayer capacitor illustrated in FIG. 1, respectively.

Figure 2A:
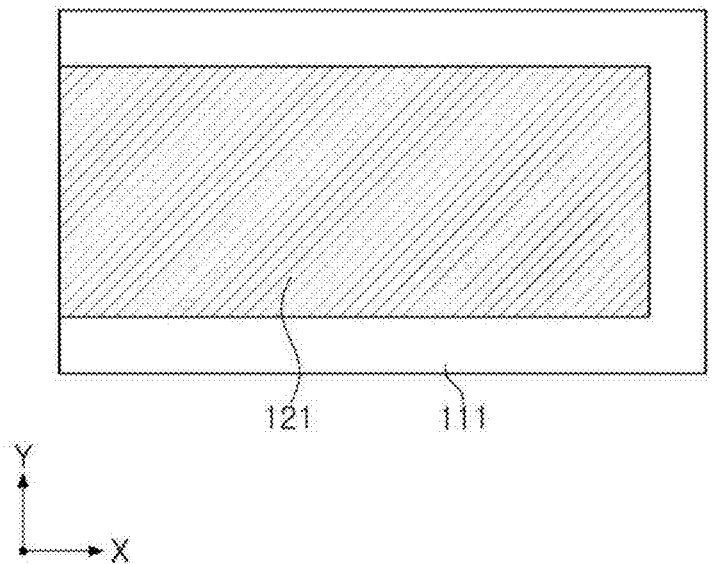
FIGS. 2A and 2B are plan diagrams illustrating first and second internal electrodes of a multilayer capacitor illustrated in FIG. 1, respectively.
Figure 2B:
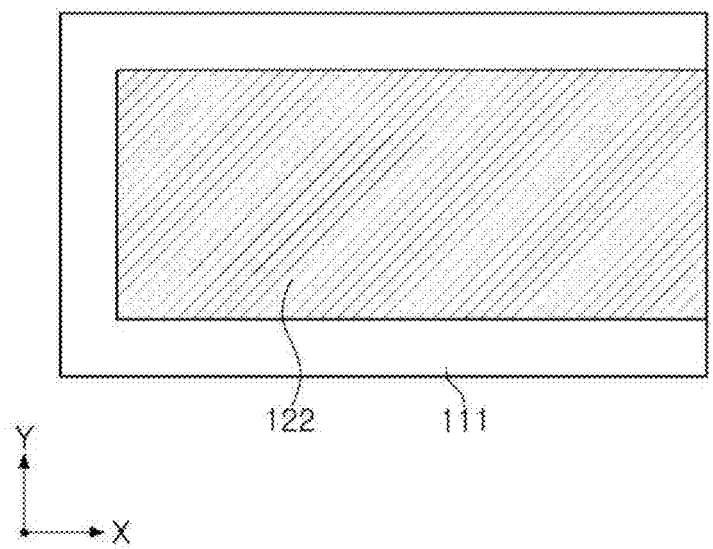

In the description below, a structure of a multilayer capacitor applied in an electronic component will be described with reference to FIGS. 1 to 2B.

A capacitor 100 in the example embodiment may include a capacitor body 110 and first and second external electrodes 131 and 132 disposed on both ends of the capacitor body 110 arranged in an X direction.

The capacitor body 110 may be formed by layering a plurality of dielectric layers 111 in a Z direction and sintering the layered dielectric layers. A boundary between adjacent dielectric layers 111 of the capacitor body 110 may be integrated such that it may be difficult to identify the boundary without using a scanning electron microscope (SEM).

The capacitor body 110 may include the plurality of dielectric layers 111 and first and second internal electrodes 121 and 122 having different polarities and disposed alternately in a Z direction with the dielectric layer 111 interposed therebetween.

The capacitor body 110 may include an active region contributing to forming capacitance of the capacitor, and cover regions 112 and 113 arranged in both side portions of the capacitor body 110 in a Y direction and arranged in upper and lower portions of the active region in a Z direction, respectively, as margin portions.

A shape of the capacitor body 110 may not be limited to any particular shape. The capacitor body 110 may have a hexahedral shape, for example, and may have first and second surfaces 1 and 2 opposing each other in a Z direction, third and fourth surfaces 3 and 4 connected to the first and second surfaces 1 and 2 and opposing each other in an X direction, and fifth and sixth surfaces 5 and 6 connected to the first and second surfaces 1 and 2 and to the third and fourth surfaces 3 and 4 and opposing each other.

The dielectric layer 111 may include a ceramic powder, such as a $BaTiO_3$ based ceramic powder, and the like, for example.

A $BaTiO_3$ based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially employed in $BaTiO_3$, but an example of the $BaTiO_3$ based ceramic powder may not be limited thereto.

The dielectric layer 111 may further include ceramic additives, organic solvents, plasticizers, coupling agents, dispersing agents, and the like, in addition to the ceramic powder.

The ceramic additive may include, for example, a transition metal oxide or a transition metal carbide, a rare earth element, magnesium (Mg) or aluminum (Al), and the like.

The first and second internal electrodes 121 and 122 may be applied with different polarities, and may be disposed on the dielectric layer 111 and may be layered in the Z direction. The first and second internal electrodes 121 and 122 may be alternately disposed in the capacitor body 110 in the Z direction to oppose each other with a single dielectric layer 111 interposed therebetween.

The first and second internal electrodes 121 and 122 may be electrically insulated with each other by the dielectric layer 111 interposed therebetween.

Figure 7:
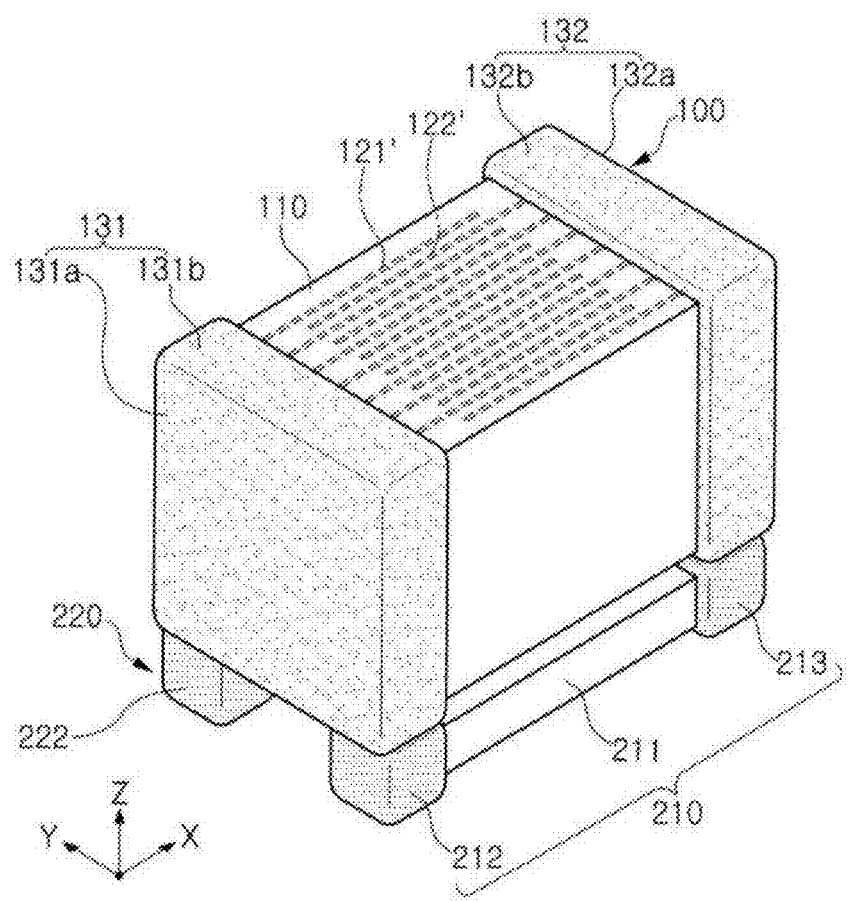
FIG. 7 is a perspective diagram illustrating an electronic component according to another example embodiment of the present disclosure'

The diagram illustrates an example in which the internal electrodes are layered in the Z direction, but an example embodiment thereof is not limited thereto. If desired, the internal electrodes 121' and 122' may be configured to be layered in the Y direction as illustrated in FIG. 7.

One ends of the first and second internal electrodes 121 and 122 may be exposed through the third and fourth surfaces 3 and 4 of the capacitor body 110, respectively.

End portions of the first and second internal electrodes 121 and 122 alternately exposed through the third and fourth surfaces 3 and 4 of the capacitor body 110 may be electrically connected to the first and second external electrodes 131 and 132, respectively, which are disposed on both ends of the capacitor body 110 arranged in the X direction.

Accordingly, when a certain level of voltage is applied to the first and second external electrodes 131 and 132, an electric charge may be accumulated between the first and second internal electrodes 121 and 122.

Capacitance of the multilayer capacitor 100 may be proportional to an overlap area between the first and second internal electrodes 121 and 122 overlapping in the Z direction in the active region.

A material of the first and second internal electrodes 121 and 122 may not be limited to any particular material. For example, the first and second internal electrodes 121 and 122 may be formed of a conductive paste including one or more of platinum (Pt), palladium (Pd), palladium-silver (Pd—Ag) alloy, nickel (Ni), and copper (Cu).

As a method of printing the conductive paste, a screen printing method, a gravure method, or the like, may be used, but an example of the method may not be limited thereto.

The first and second external electrodes 131 and 132 may be provided with voltages having different polarities, may be disposed on both ends of the body 110 arranged in the X direction, and may be electrically connected to the exposed end portions of the first and second internal electrodes 121 and 122, respectively.

The first external electrode 131 may include a head portion 131a and a first band portion 131b.

The head portion 131a may be disposed on the third surface 3 of the capacitor body 110, may be connected to the end portion of the first internal electrode 121 exposed externally through the third surface 3 of the capacitor body 110, and may electrically connect the first internal electrode 121 and the first external electrode 131 to each other.

The first band portion 131b may be a region extending from the head portion 131a to a portion of the first surface of the capacitor body 110.

The first band portion 131b may further extend to portions of the second, fifth, and sixth surfaces of the capacitor body 110 from the first head portion 131a to improve adhesion strength, and the like.

The second external electrode 132 may include a second head portion 132a and a second band portion 132b.

The second head portion 132a may be disposed on the fourth surface 4 of the capacitor body 110, may be connected the end portion of the second internal electrode 122 exposed externally through the fourth surface 4 of the capacitor body 110, and may electrically connect the second internal electrode 122 and the second external electrode 132 to each other.

The second band portion 132b may be a region extending to a portion of the first surface of the capacitor body 110 from the second head portion 132a.

The second band portion 132b may further extend to portions of the second, fifth, and sixth surfaces of the capacitor body 110 from the second head portion 132a to improve adhesion strength, and the like.

Each of the first and second external electrodes 131 and 132 may further include a plating layer.

The plating layer may include first and second nickel (Ni) plated layers, and first and second tin (Sn) plated layers covering the first and second nickel plated layers, respectively.

Figure 3:
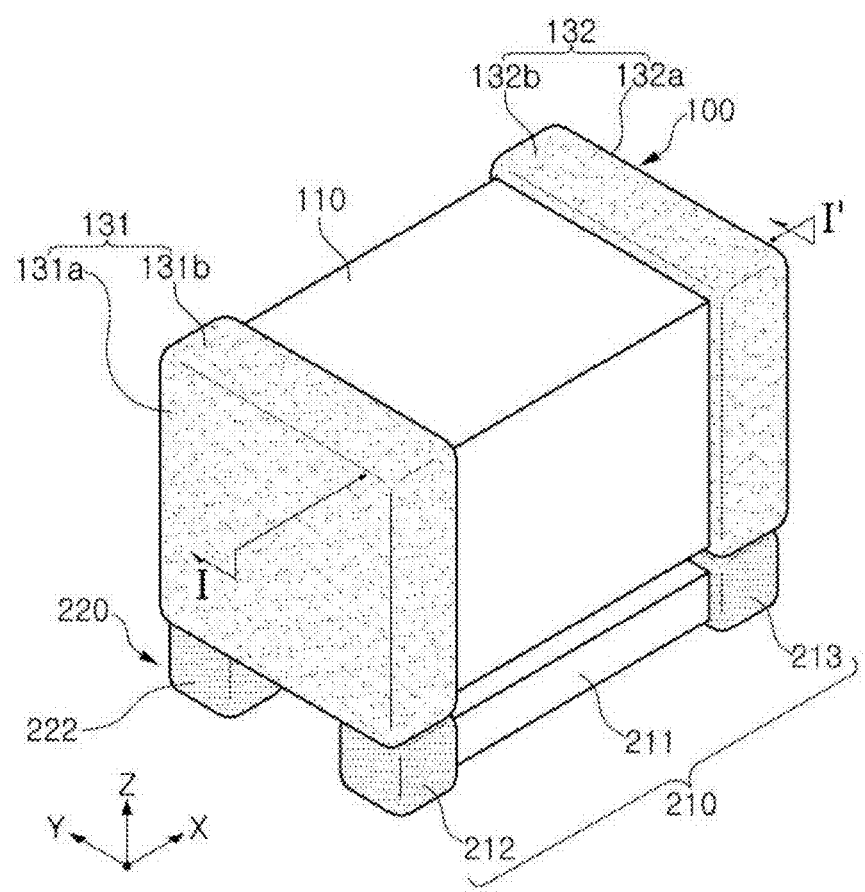
FIG. 3 is a perspective diagram illustrating an electronic component according to an example embodiment of the present disclosure.
Figure 4:
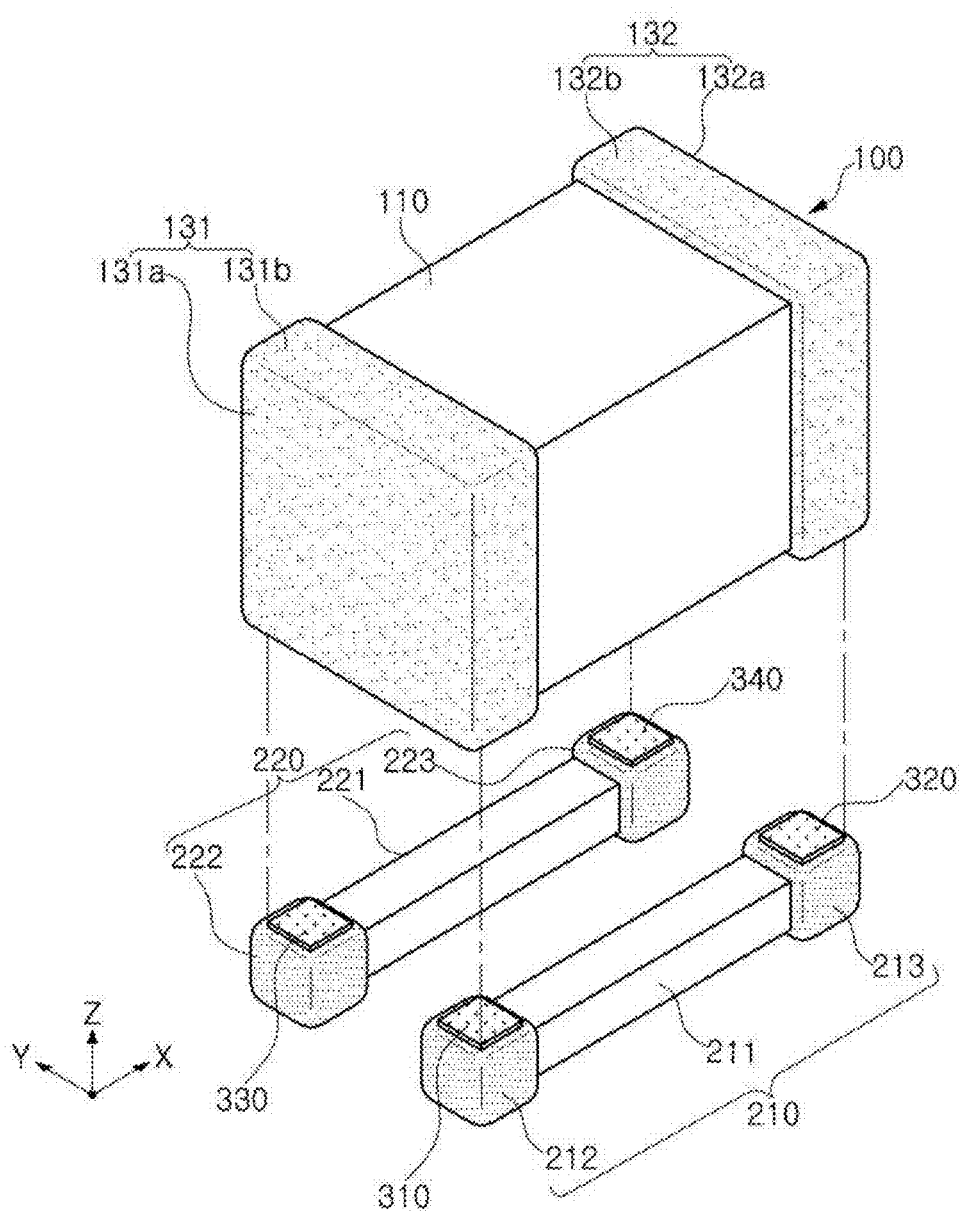
FIG. 4 is a perspective diagram illustrating an electronic component in separated form.
Figure 5:
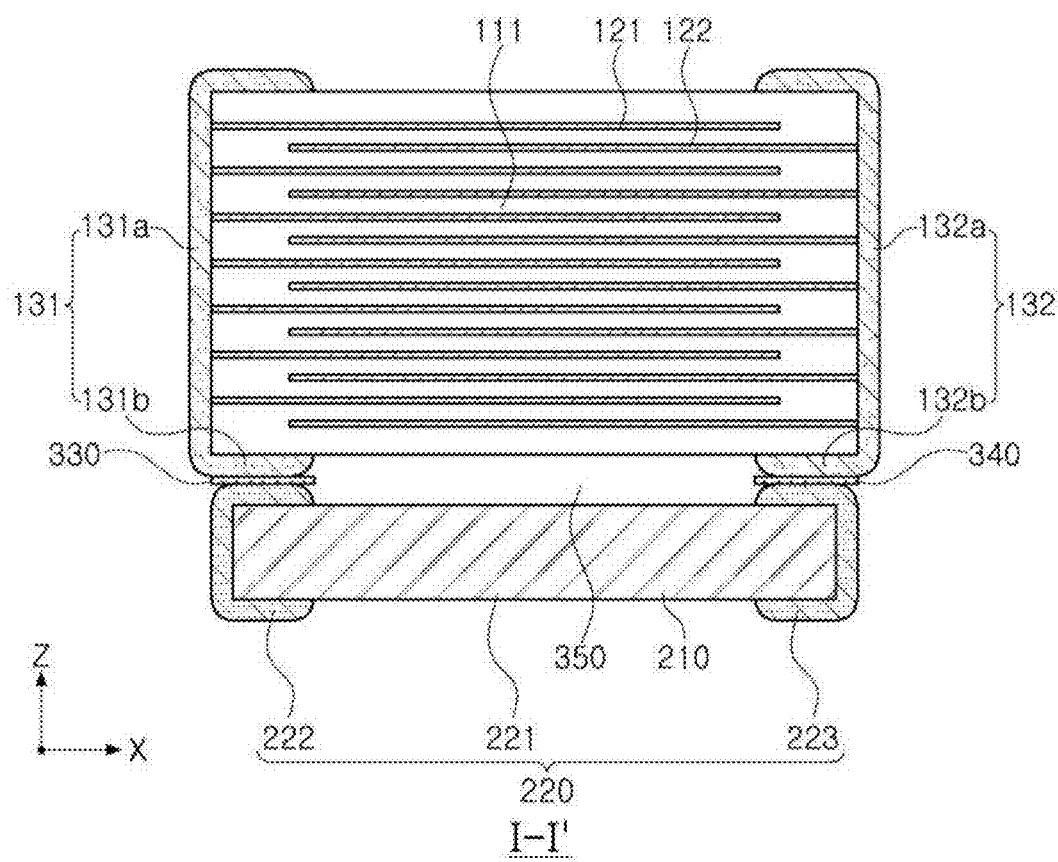
FIG. 5 is a cross-sectional diagram taken along line I-I' in FIG. 3.

FIG. 3 is a perspective diagram illustrating an electronic component according to an example embodiment. FIG. 4 is a perspective diagram illustrating an electronic component in separated form. FIG. 5 is a cross-sectional diagram taken along line I-I' in FIG. 3.

Referring to FIGS. 3 to 5, the electronic component of the example embodiment may include first and second connection terminals 210 and 220.

The first and second connection terminals 210 and 220 may be disposed on the first surface of a multilayer capacitor 100 and may be spaced apart from each other in the Y direction.

A space between the first and second connection terminals 210 and 220 formed in the Y direction may work as a solder pocket in which a solder fillet is accommodated when the electronic component is mounted on the substrate. Accordingly, the magnitude of piezoelectric vibrations of the multilayer capacitor 100 transmitted to the substrate may decrease, and acoustic noise of the electronic component may be reduced.

The first connection terminal 210 may include a first support member 211 having a bar shape, may have first and second conductive portions 212 and 213 on both ends of the first support member 211 arranged in the X direction, respectively, and may be disposed on the first surface of the capacitor body 110.

The first support member 211 may be formed of an insulating material. For example, the first support member 211 may be formed of a ceramic material, such as alumina, for example.

As the ceramic material has stiffness, the ceramic material may prevent piezoelectric vibrations of the capacitor body 110 from being transmitted to the X, Y, and Z directions, thereby reducing acoustic noise.

The first conductive portion 212 may be connected to the first band portion 131b of the first external electrode 131, and the second conductive portion 213 may be connected to the second band portion 132b of the second external electrode 132.

The first support member 211 may have a hexahedral shape, and the first conductive portion 212 may be disposed on the fifth surface, such as on a head surface, portions of upper and lower surfaces, portions of both side surfaces, and the like, of the first support member 211, on one end of the first support member 211 taken in the X direction.

The second conductive portion 213 may be disposed on the fifth surface, such as on a head surface, portions of upper and lower surfaces, portions of both side surfaces, and the like, of the first support member 211, on the other end of the first support member 211 taken in the X direction.

Conducive adhesive materials 310 and 320 may be disposed between the first band portion 131b and the first conductive portion 212 and between the second band portion 132b and the second conductive portion 213, respectively.

As the conducive adhesive materials 310 and 320, a material having elasticity, such as a solder having a high melting point, a conductive epoxy, or the like, may be used, and accordingly, the conducive adhesive materials 310 and 320 may absorb external force transmitted from the multilayer capacitor 100, and reliability of the multilayer capacitor 100 may improve.

The second connection terminal 220 may include a second support member 221 having a bar shape, may have third and fourth conductive portions 222 and 223 on both ends of the second support member 221 arranged in the X direction, respectively, and may be disposed on the first surface of the capacitor body 110.

The second support member 221 may be formed of an insulating material. For example, the second support member 221 may be formed of a ceramic material, such as alumina.

The third conductive portion 222 may be connected to the first band portion 131b of the first external electrode 131, and the fourth conductive portion 223 may be connected to the second band portion 132b of the second external electrode 132.

The second support member 221 may have a hexahedral shape, and the third conductive portion 222 may be formed on the fifth surface, such as on a head surface, portions of upper and lower surfaces, portions of both side surfaces, and the like, of the second support member 221, on one end of the second support member 221 taken in the X direction.

The fourth conductive portion 223 may be formed on the fifth surface, such as on a head surface, portions of upper and lower surfaces, portions of both side surfaces, and the like, of the second support member 221, for example, on the other end of the second support member 221 taken in the X direction.

Conductive adhesive materials 330 and 340 may be disposed between the first band portion 131b and the third conductive portion 222 and between the second band portion 132b and the fourth conductive portion 223, respectively.

The first and second connection terminals 210 and 220 may be adhered to the multilayer capacitor 100 and may form a plating layer, thereby improving adhesion strength.

The plating layer may include a nickel (Ni) plated layer formed on the first and second connection terminals 210 and 220, and a tin (Sn) plated layer formed on the nickel plated layer. A different material having high stiffness may also be used as the plating layer if desired.

When voltages having different polarities are applied to the first and second external electrodes 131 and 132 disposed in the electronic component, the capacitor body 110 may expand and contract in the Z direction, a thickness direction, by an inverse piezoelectric effect, and both ends of the first and second external electrodes 131 and 132 may expand and contract in an opposite direction to the direction of expansion and contraction of the capacitor body 110 taken in the Z direction by a Poisson effect and may generate vibrations.

When the electronic component is mounted on a substrate, the vibrations may be transmitted to the substrate through the first and second external electrodes 131 and 132, and the substrate may irradiate acoustic sounds, which may be acoustic noise.

However, in the example embodiment, when the electronic component is mounted on a substrate, the first and second connection terminals 210 and 220 may allow the multilayer capacitor 100 to be spaced apart from the substrate by a certain distance such that piezoelectric vibrations transmitted from the capacitor body 110 to the substrate may be reduced.

Figure 6:
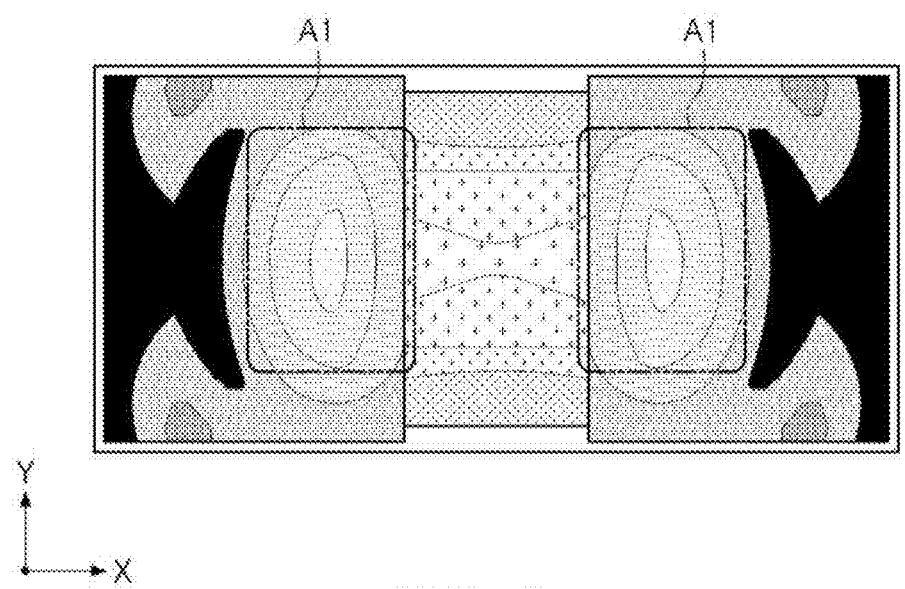
FIG. 6 is a diagram illustrating a distribution of vibration displacement area of a horizontal-type multilayer capacitor.

Referring to FIG. 6, in a horizontal-type multilayer capacitor, both side portions of the first surface, amounting surface of the capacitor body 110, with reference to a central portion in the Y direction and the X direction, may be a maximum vibration displacement area A1.

In the example embodiment, the first connection terminal 210 and the second connection terminal 220 may be spaced apart from each other in the Y direction on the first surface of the capacitor body 110, and the first to fourth conductive portions 212, 213, 222, and 223 may be disposed in lower portions of the first and second band portions 131b and 132b, end portions arranged in the X direction, such that the maximum vibration displacement area A1 may be disposed in a gap in which the first and second connection terminals 210 and 220 are not disposed.

Accordingly, in the multilayer capacitor 100, as vibrations of the maximum vibration displacement area A1 are not directly transmitted to the first and second connection terminals 210 and 220, acoustic noise may further be reduced when the electronic component is mounted on a substrate.

Figure 8:
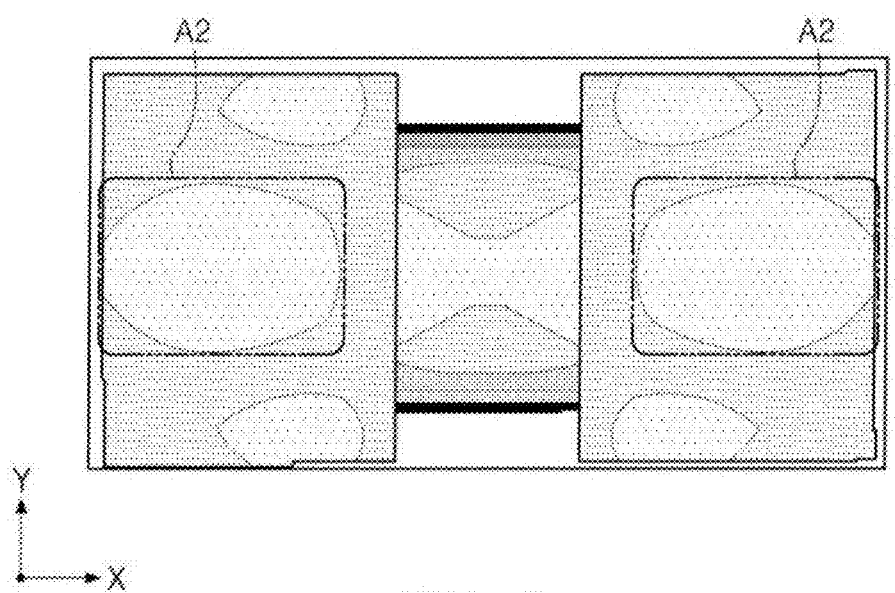
FIG. 8 is a diagram illustrating a distribution of vibration displacement area of a vertical-type multilayer capacitor.

As another example, referring to FIG. 8, in a vertical-type multilayer capacitor, both side portions of the first surface, a mounting surface of the capacitor body 110, the side portions other than a central portion taken in the Y direction and in the X direction, may be a maximum vibration displacement area A2.

In the example embodiment, the first connection terminal 210 and the second connection terminal 220 may be spaced apart from each other in the Y direction on the first surface of the capacitor body 110, and the first to fourth conductive portions 212, 213, 222, and 223 may be disposed in lower portions of the first and second band portions 131b and 132b, end portions arranged in the X direction, such that the maximum vibration displacement area A2 may be disposed in a gap in which the first and second connection terminals 210 and 220 are not disposed.

Accordingly, in the multilayer capacitor 100, as vibrations of the maximum vibration displacement area A2 are not directly transmitted to the first and second connection terminals 210 and 220, acoustic noise may further be reduced when the electronic component is mounted on a substrate.

Also, according to the example embodiment, by including the structure which may reduce acoustic noise, the amount of piezoelectric vibrations of the electronic component transmitted to a substrate may be effectively prevented in an audio frequency of 20 kHz or lower of the electronic component.

Thus, by reducing high frequency vibrations of the electronic component, miss-operations of sensors used in IT or automotive industries, caused by high frequency vibrations of an electronic component generated in a frequency of 20 kHz or higher, may be prevented, and accumulation of internal fatigue caused by vibrations of sensors generated for a long time may be prevented.

Figure 9:
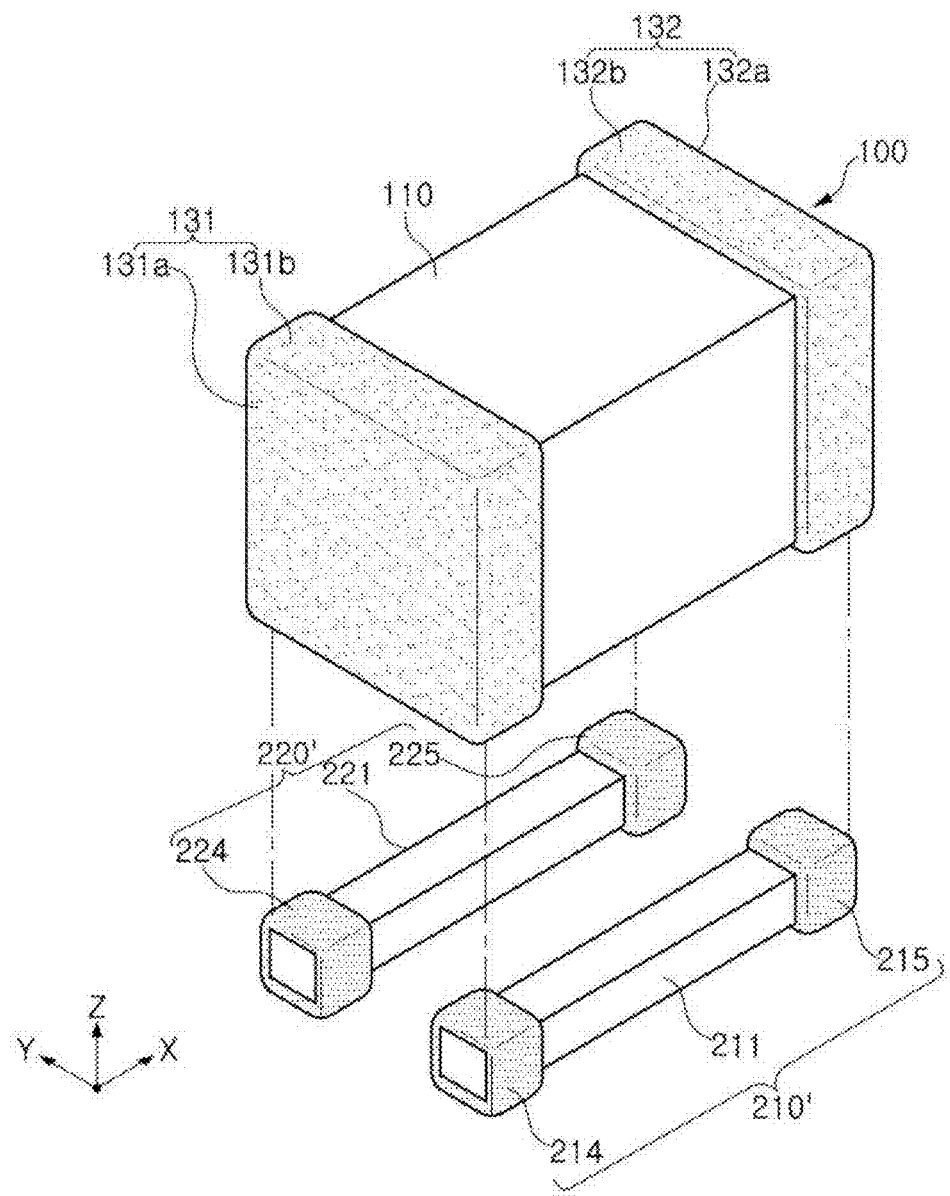
FIG. 9 is a perspective diagram illustrating first and second connection terminals according to another example embodiment.

FIG. 9 is a perspective diagram illustrating first and second connection terminals according to another example embodiment.

Referring to FIG. 9, in a first connection terminal 210', a first conducive portion 214 may not be disposed on a head surface of one end of a first support member 211 taken in the X direction.

Thus, the first conducive portion 214 may be disposed on the fourth surface on one end of the first support member 211 taken in the X direction, and may be disposed on portions of upper and lower surfaces and portions of both side surfaces.

Also, a second conductive portion 215 may not be disposed on a head surface of the other end of the first support member 211 taken in the X direction.

Thus, the second conductive portion 215 may be disposed on the fourth surface on the other end of the first support member 211 taken in the X direction, and may be disposed on portions of upper and lower surfaces and portions of both side surfaces.

In a second connection terminal 220', a third conductive portion 224 may not be disposed on a head surface of one end of a second support member 221 taken in the X direction.

Thus, the third conductive portion 224 may be disposed on the fourth surface on one end of the second support member 221 taken in the X direction, and may be only disposed on portions of upper and lower surfaces and portions of both side surfaces.

A fourth conductive portion 225 may not be disposed on a head surface of the other end of the second support member 221 taken in the X direction.

Thus, the fourth conductive portion 225 may be only disposed on the fourth surface on the other end of the second support member 221 taken in the X direction, and may be disposed on portions of upper and lower surfaces and portions of both side surfaces.

Thus, when the electronic component of the example embodiment is mounted on a substrate, a solder may not be disposed on both head surfaces of the first and second connection terminals 210' and 220' disposed in the X direction on each of which the conductive portion is not disposed, and accordingly, an overall height of a solder may be reduced.

Accordingly, the magnitude of piezoelectric vibrations transmitted from the multilayer capacitor 100 to the substrate may decrease, and acoustic noise of the electronic component may be reduced.

Figure 10:
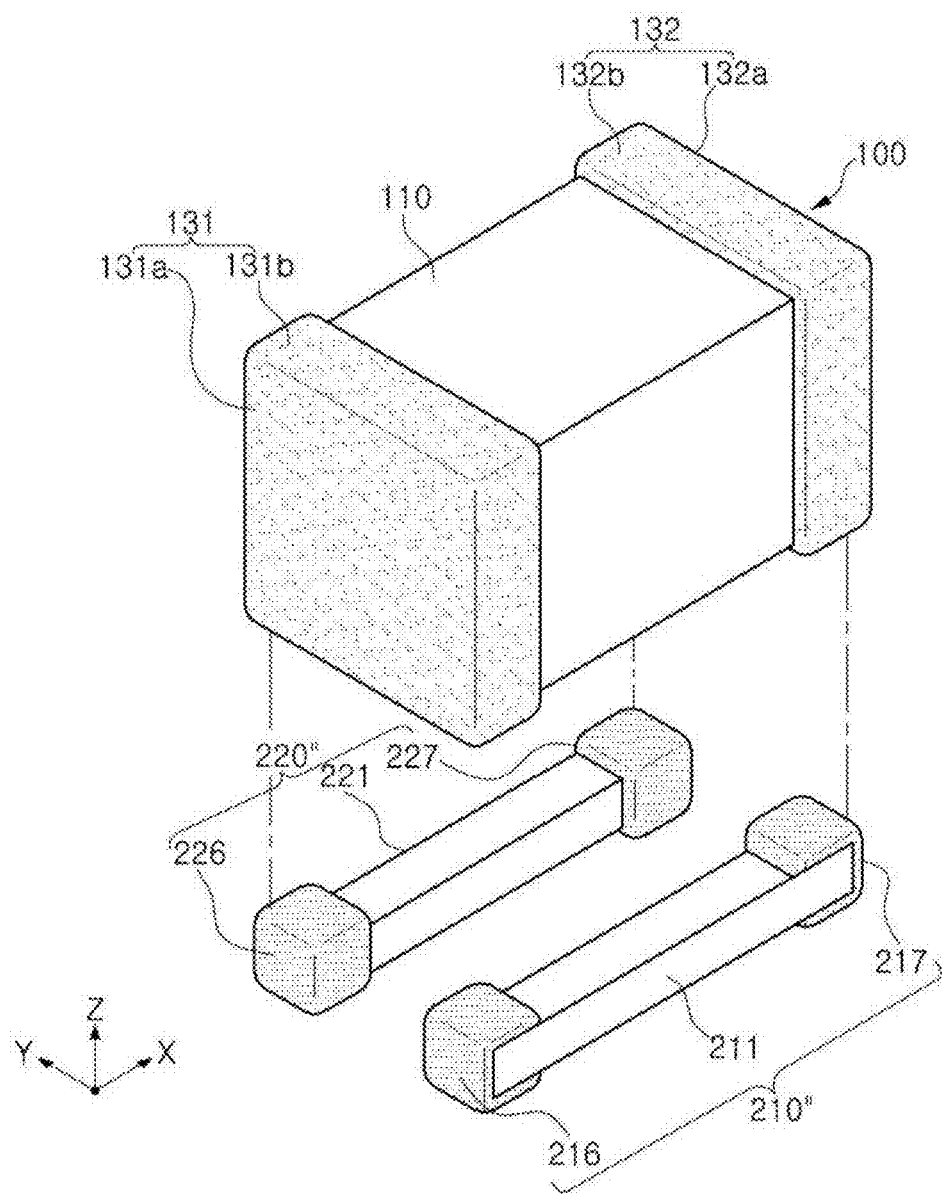
FIG. 10 is a perspective diagram illustrating first and second connection terminals according to another example embodiment.

FIG. 10 is a perspective diagram illustrating first and second connection terminals according to another example embodiment.

Referring to FIG. 10, in a first connection terminal 210", a first conductive portion 216 may not be disposed on an external side surface taken in the Y direction on one end of a first support member 211 taken in the X direction.

Thus, the first conductive portion 216 may be disposed on the fourth surface on one end of the first support member 211 taken in the X direction, and may be disposed on a head surface, portions of upper and lower surfaces, and a portion of an internal surface of both side surfaces.

Also, a second conductive portion 217 may not be disposed on an external side surface taken in the Y direction on the other end of the first support member 211 taken in the X direction.

Thus, the second conductive portion 217 may be disposed on the fourth surface on the other end of the first support member 211 taken in the X direction, and may be disposed on a head surface, portions of upper and lower surfaces, and a portion of an internal surface of both side surfaces.

In a second connection terminal 220", a third conductive portion 226 may not be disposed on an external side surface taken in the Y direction on one end of a second support member 221 taken in the X direction.

Thus, the third conductive portion 226 may be disposed on the fourth surface on one end of the second support member 221 taken in the X direction, and may be disposed on a head surface, portions of upper and lower surfaces, and a portion of an internal surface of both side surfaces.

A fourth conductive portion 227 may not be disposed on an external side surface taken in the Y direction on the other end of the second support member 221 taken in the X direction.

Thus, the fourth conductive portion 227 may be disposed on the fourth surface on the other end of the second support member 221 taken in the X direction, and may be disposed on a head surface, portions of upper and lower surfaces, and a portion of an internal side surface of both side surfaces.

Thus, when the electronic component of the example embodiment is mounted on a substrate, a solder may not be disposed on an external side surface on each of both ends of the first and second connection terminals 210" and 220" disposed in the X direction on which the conductive portion is not disposed, and accordingly, an overall height of a solder may be reduced.

Accordingly, the magnitude of piezoelectric vibrations transmitted from the multilayer capacitor 100 to the substrate may decrease, and acoustic noise of the electronic component may be reduced.

Figure 11:
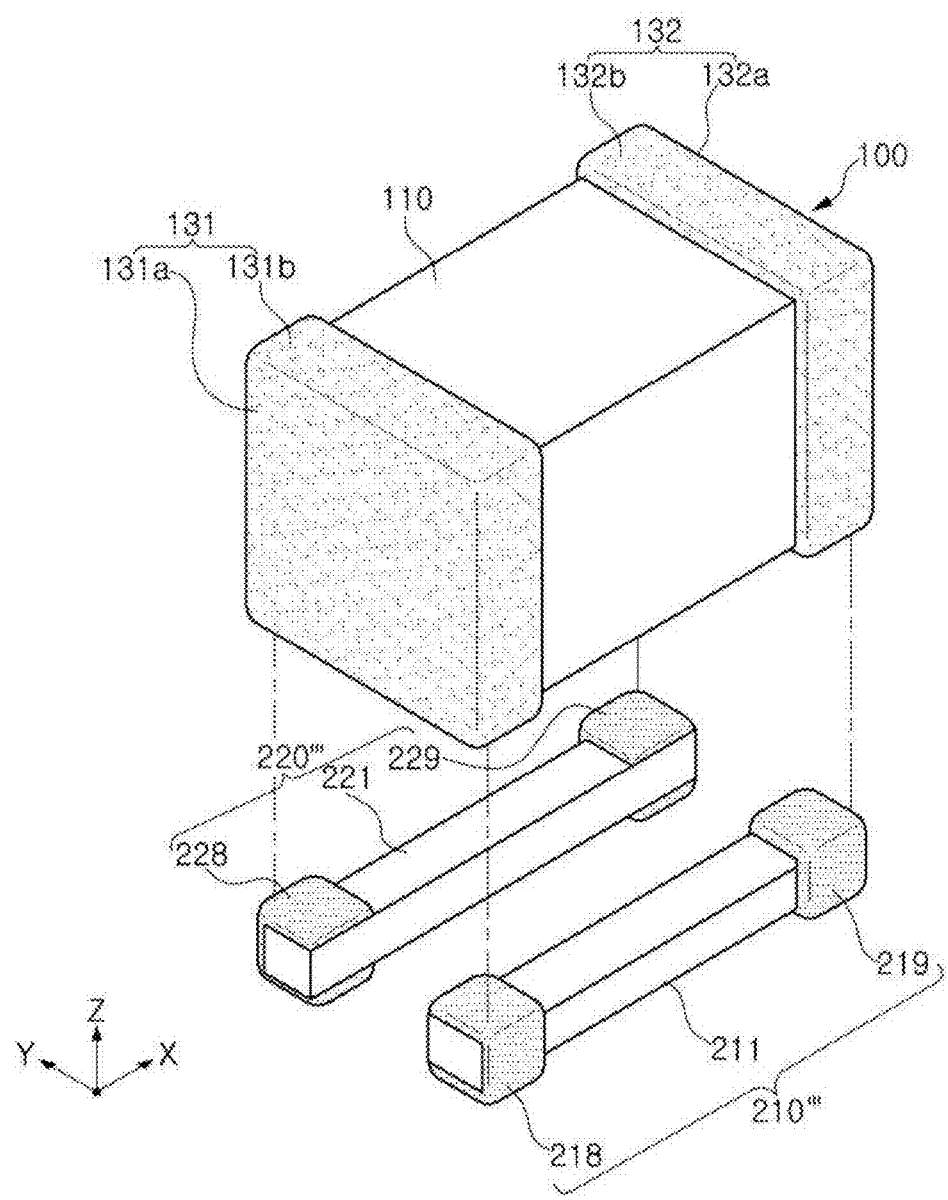
FIG. 11 is a perspective diagram illustrating first and second connection terminals according to another example embodiment.

FIG. 11 is a perspective diagram illustrating first and second connection terminals according to another example embodiment.

Referring to FIG. 11, in a first connection terminal 210''', a first conductive portion 218 may not be formed on a head surface and an internal side surface taken in the Y direction on one end of a first support member 211 taken in the X direction.

Thus, the first conductive portion 218 may be disposed on the third surface on one end of the first support member 211 taken in the X direction, and may be disposed on portions of upper and lower surface and a portion of an external surface of both side surfaces.

Also, a second conductive portion 219 may not be disposed on a head surface and an internal side surface taken in the Y direction on the other end of the first support member 211 taken in the X direction.

Thus, the second conductive portion 219 may be disposed on the third surface on the other end of the first support member 211 taken in the X direction, and may be disposed on portions of upper and lower surfaces and a portion of an external surface of both side surfaces.

In a second connection terminal 220''', a third conductive portion 228 may not be disposed on a head surface and an internal side surface taken in the Y direction on one end of the second support member 221 taken in the X direction.

Thus, the third conductive portion 228 may be disposed on the third surface on one end of the second support member 221 taken in the X direction, and may be disposed on portions of upper and lower surfaces and a portion of an external surface of both side surfaces.

A fourth conductive portion 229 may not be disposed on a head surface and an internal side surface taken in the Y direction on the other end of the second support member 221 taken in the X direction.

Thus, the fourth conductive portion 229 may be disposed on the third surface on the end of the second support member 221 taken in the X direction, and may be disposed on portions of upper and lower surfaces and a portion of an external surface of both side surfaces.

Thus, when the electronic component of the example embodiment is mounted on a substrate, a solder may not be disposed on a head surface and an internal side surface on each of both ends of the first and second connection terminals 210''' and 220''' disposed in the X direction on which the conductive portion is not disposed, and accordingly, an overall height of a solder may be reduced.

Accordingly, the magnitude of piezoelectric vibrations transmitted from the multilayer capacitor 100 to the substrate may decrease, and acoustic noise of the electronic component may be reduced.

Figure 12:
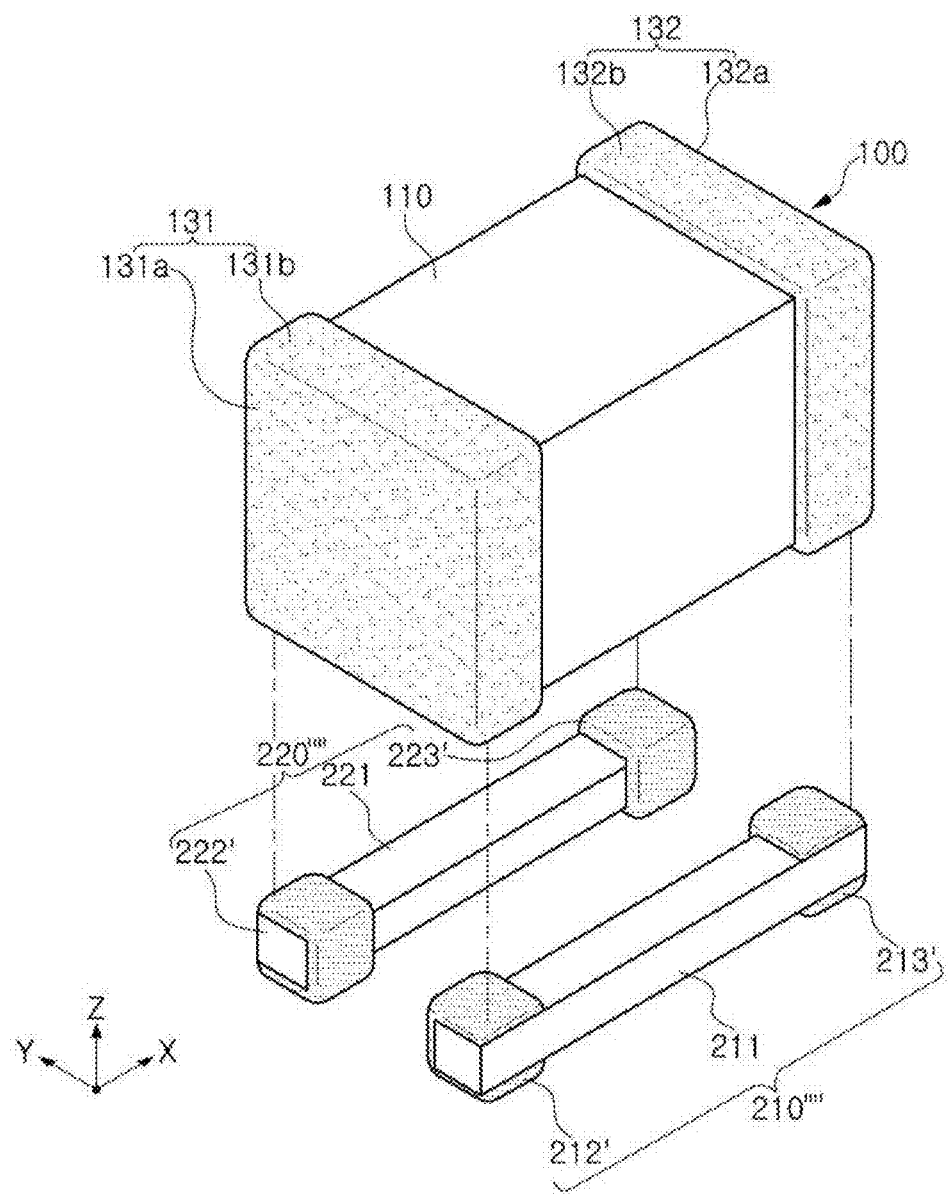
FIG. 12 is a perspective diagram illustrating first and second connection terminals according to another example embodiment.

FIG. 12 is a perspective diagram illustrating first and second connection terminals according to another example embodiment.

Referring to FIG. 12, in a first connection terminal 210'''', a first conductive portion 212' may not be disposed on a head surface and an internal side surface taken in the Y direction on one end of a first support member 211 taken in the X direction.

Thus, the first conductive portion 212' may be disposed on the third surface on one end of the first support member 211 taken in the X direction, and may be disposed on portions of upper and lower surfaces and a portion of an internal surface of both side surfaces.

Also, a second conductive portion 213' may not be disposed on a head surface and an internal side surface taken in the Y direction on the other end of the first support member 211 taken in the X direction.

Thus, the second conductive portion 213' may be disposed on the third surface on the other end of the first support member 211 taken in the X direction, and may be disposed on portions of upper and lower surfaces and a portion of an internal surface of both side surfaces.

In a second connection terminal 220'''', a third conductive portion 222' may not be disposed on a head surface and an internal side surface taken in the Y direction on one end of a second support member 221 taken in the X direction.

Thus, the third conductive portion 222' may be disposed on the third surface on one end of the second support member 221 taken in the X direction, and may be disposed on portions of upper and lower surfaces and a portion of an internal surface of both side surfaces.

Also, a fourth conductive portion 223' may not be disposed on a head surface and an internal side surface taken in the Y direction on the other end of the second support member 221 taken in the X direction.

Thus, the fourth conductive portion 223' may be disposed on the third surface on the other end of the second support member 221 taken in the X direction, and may be disposed on portions of upper and lower surfaces and a portion of an internal surface of both side surfaces.

Thus, when the electronic component of the example embodiment is mounted on a substrate, a solder may not be disposed on a head surface and an external side surface on each of both ends of the first and second connection terminals 210'''' and 220'''' disposed in the X direction on which the conductive portion is not disposed, and accordingly, a height of a solder may be reduced.

Accordingly, the magnitude of piezoelectric vibrations transmitted from the multilayer capacitor 100 to the substrate may decrease, and acoustic noise of the electronic component may be reduced.

According to the aforementioned example embodiments, acoustic noise and high frequency vibrations generated in a frequency of 20 kHz or higher of an electronic component may be reduced.

While the exemplary embodiments have been shown and described above, it will be apparent to those skilled in the art that modifications and variations could be made without departing from the scope of the present invention as defined by the appended claims.

What is claimed is:

1. An electronic component, comprising:
   a capacitor body including a plurality of dielectric layers and a plurality of first and second internal electrodes alternately disposed with the dielectric layers interposed therebetween, having first and second surfaces opposing each other, third and fourth surfaces connected to the first and second surfaces and opposing each other, fifth and sixth surfaces connected to the first and second surfaces and the fifth and fourth surfaces and opposing each other, and including one ends of the first and second internal electrodes exposed through the third and fourth surfaces, respectively;
   first and second external electrodes respectively including first and second head portions disposed on the third and fourth surfaces of the capacitor body, respectively, and first and second band portions extending from the first and second head portions to a portion of the first surface of the capacitor body;
   a first connection terminal including a first support member extending in a direction connecting the third and fourth surfaces, the first support member having first and second conductive portions disposed on opposing ends thereof and connected to the first and second band portions, respectively, the first connection terminal disposed on the first surface of the capacitor body; and
   a second connection terminal including a second support member extending in the direction connecting the third and fourth surfaces, the second support member having third and fourth conductive portions disposed on opposing ends thereof and connected to the first and second band portions, respectively, the second connection terminal disposed on the first surface of the capacitor body,
   wherein the second support member is spaced apart from the first support member in a direction connecting the fifth and sixth surfaces.

2. The electronic component of claim 1, further comprising a conductive adhesive material disposed between the first band portion and the first conductive portion, between the first band portion and the second conductive portion, between the second band portion and the third conductive portion, and between the second band portion and the fourth conductive portion, respectively.

3. The electronic component of claim 1, wherein each of the first and second support members is made of alumina.

4. The electronic component of claim 3, wherein each of the first and second support members has a bar shape.

5. The electronic component of claim 1, wherein the first and second internal electrodes are disposed in a direction connecting the first and second surfaces of the capacitor body.

6. The electronic component of claim 1, wherein the first and second internal electrodes are disposed in the direction connecting the fifth and sixth surfaces of the capacitor body.

7. The electronic component of claim 1, wherein each of the first and second support members has a hexahedral shape,
   the first and second conductive portions are disposed on head portions, portions of upper and lower surfaces, and portions of opposing side surfaces of the opposing ends of the first support member, respectively, and the third and fourth conductive portions are disposed on head portions, portions of upper and lower surfaces, and portions of opposing side surfaces of the opposing ends of the second support member, respectively.

8. The electronic component of claim 1, wherein each of the first and second support members has a hexahedral shape,
the first and second conductive portions are disposed on portions of upper and lower surfaces and portions of opposing side surfaces of the opposing ends of the first support member, respectively, and
the third and fourth conductive portions are disposed on portions of upper and lower surfaces and portions of opposing side surfaces of the opposing ends of the second support member, respectively.

9. The electronic component of claim 1, wherein each of the first and second support members, each of which has a hexahedral shape,
the first and second conductive portions are disposed on head surfaces, portions of upper and lower surfaces, and portions of internal side surfaces of the opposing ends of the first support member, respectively, and
the third and fourth conductive portions are disposed on head surfaces, portions of upper and lower surfaces, and portions of internal side surfaces of the opposing ends of the second support member, respectively.

10. The electronic component of claim 1, wherein each of the first and second support members has a hexahedral shape,
the first and second conductive portions are disposed on portions of upper and lower surfaces and portions of external side surfaces of the opposing ends of the first support member, respectively, and
the third and fourth conductive portions are disposed on portions of upper and lower surfaces and portions of external side surfaces of the opposing ends of the second support member, respectively.

11. The electronic component of claim 1, wherein each of the first and second support members has a hexahedral shape,
the first and second conductive portions are disposed on portions of upper and lower surfaces and portions of internal side surfaces on the opposing ends of the first support member, respectively, and
the third and fourth conductive portions are disposed on portions of upper and lower surfaces and portions of internal side surfaces on the opposing ends of the second support member, respectively.

12. The electronic component of claim 1, wherein the first and second support members are arranged so as to define a space therebetween which extends, from one to another of the opposing ends of the respective first and second support members, in the direction connecting the third and fourth surfaces, and
wherein the space is closed in the direction connecting the fifth and sixth surfaces and open in the direction connecting the third and fourth surfaces.

* * * * *